(12) United States Patent
Lee et al.

(10) Patent No.: US 7,183,163 B2
(45) Date of Patent: Feb. 27, 2007

(54) METHOD OF MANUFACTURING AN ISOLATION-LESS, CONTACT-LESS ARRAY OF BI-DIRECTIONAL READ/PROGRAM NON-VOLATILE FLOATING GATE MEMORY CELLS WITH INDEPENDENT CONTROLLABLE CONTROL GATES

(75) Inventors: Dana Lee, Santa Clara, CA (US); Bomy Chen, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 22 days.

(21) Appl. No.: 10/824,016

(22) Filed: Apr. 13, 2004

(65) Prior Publication Data
US 2004/0197997 A1     Oct. 7, 2004

Related U.S. Application Data

(63) Continuation-in-part of application No. 10/409,407, filed on Apr. 7, 2003.

(51) Int. Cl.
*H01L 29/788*   (2006.01)
*H01L 21/8238*  (2006.01)
*H01L 21/336*   (2006.01)

(52) U.S. Cl. .................. 438/266; 438/201; 257/316

(58) Field of Classification Search ............... 438/239, 438/22, 242, 243, 244, 246, 248, 257, 259, 438/267, 270, 386, 387; 257/301, 302, 314, 257/315
See application file for complete search history.

(56) References Cited

U.S. PATENT DOCUMENTS 5,021,999 A    6/1991 Kohda et al.
5,029,130 A    7/1991 Yeh
5,739,567 A *  4/1998 Wong ........................ 257/316
5,768,192 A    6/1998 Eitan
6,002,152 A   12/1999 Guterman et al.

(Continued)

OTHER PUBLICATIONS

IEEE, 2002, entitled "Quantum-well Memory Device (QW/MD) With Extremely Good Charge Retention," Z. Krivokapic, et al. (4 pages).

*Primary Examiner*—Michael Trinh
*Assistant Examiner*—Kiesha Rose
(74) *Attorney, Agent, or Firm*—DLA Piper US LLP

(57) ABSTRACT

A method of making an isolation-less, contact-less array of bi-directional read/program non-volatile memory cells is disclosed. Each memory cell has two stacked gate floating gate transistors, with a switch transistor there between. The source/drain lines of the cells and the control gate lines of the stacked gate floating gate transistors in the same column are connected together. The gate of the switch transistors in the same row are connected together. Spaced apart trenches are formed in a substrate in a first direction. Floating gates are formed in the trenches, along the side wall of the trenches. A buried source/bit line is formed at the bottom of each trench. A control gate common to both floating gates is also formed in each trench insulated from the floating gates, capacitively coupled thereto, and insulated from the buried source/bit line. Transistor gates parallel to one another are formed in a second direction, substantially perpendicular to the first direction on the planar surface of the substrate. In one embodiment, openings between the rows of transistor gates are used to cut the floating gates in the trenches, without cutting the control gates.

11 Claims, 5 Drawing Sheets

U.S. PATENT DOCUMENTS

| | | |
|---|---|---|
| 6,011,725 A | 1/2000 | Eitan |
| 6,093,945 A | 7/2000 | Yang |
| 6,103,573 A | 8/2000 | Harari et al. |
| 6,281,545 B1 | 8/2001 | Liang et al. |
| 6,329,685 B1 | 12/2001 | Lee |
| 6,420,231 B1 | 7/2002 | Harari et al. |
| 6,426,896 B1 | 7/2002 | Chen |
| 6,541,815 B1 * | 4/2003 | Mandelman et al. ....... 257/315 |
| 6,597,036 B1 | 7/2003 | Lee et al. |
| 2002/0056870 A1 | 5/2002 | Lee et al. |
| 2002/0163031 A1 | 11/2002 | Lee et al. |

* cited by examiner

US 7,183,163 B2

METHOD OF MANUFACTURING AN ISOLATION-LESS, CONTACT-LESS ARRAY OF BI-DIRECTIONAL READ/PROGRAM NON-VOLATILE FLOATING GATE MEMORY CELLS WITH INDEPENDENT CONTROLLABLE CONTROL GATES

The application is a continuation in part of a pending application filed on Apr. 7, 2003, Ser. No. 10/409,407, whose disclosure is incorporated herein in its entirety.

TECHNICAL FIELD

The present invention relates to a method of making an array of bi-directional read/program non-volatile memory cells, each of which uses a floating gate for storage of charges. More particularly, the present invention relates to such a method to make an isolation-less, and contact-less array.

BACKGROUND OF THE INVENTION

Nonvolatile memory cells having a floating gate for the storage of charges thereon to control the conduction of current in the channel in the substrate of the semiconductive material is well known in the art. See, for example, U.S. Pat. No. 5,029,130 whose disclosure is incorporated herein by reference in its entirety. Structurally, nonvolatile memory cells using a floating gate for storage can be classified as either a stacked gate configuration or a split gate configuration. In a stacked gate, a control gate is positioned directly over the floating gate. In a split gate, the control gate is positioned to one side and controls another portion of the channel along with the floating gate.

Contact-less arrays of floating gate nonvolatile memory cells are also well known in the art. The term "contact-less" means the source lines and the bit lines to the memory cells in the array are buried. Contact-less permits the memory cells to be positioned closer together since contacts or vias do not have to be etched in the semiconductor structure to contact the bit line or the source line. See, for example, U.S. Pat. Nos. 6,420,231 and 6,103,573. These patents disclose a contact-less array of floating gate nonvolatile memory cells but using field oxide to separate rows or columns of memory cells.

A schematic diagram of an array 10 of floating gate nonvolatile memory cells disclosed in U.S. Pat. Nos. 6,420,231 and 6,103,573 is shown on FIG. 1. The array 10 comprises a plurality memory cells 15 arranged in a plurality of rows and columns. Each memory cell 15 comprises a conventional transistor 11 having a gate and a first terminal and second terminal. In addition, the memory cell 15 comprises two stacked gate floating gate transistors 17, each having a control gate 38, a floating gate 34, a first terminal and a second terminal. The transistor 11 is connected between the two stacked gate floating gate transistors. Thus each memory cell 15 has five terminals: a first terminal 32a of a first stacked gate transistor 17, a second terminal 32b of a second stacked gate transistor 17, the gate of the transistor 11, and the control gates of the two stacked gate floating gate transistors. Further, memory cells 15 in the same column (or row) have their second terminals 32a of their second stacked gate transistors 17 connected together, and the first terminals of their first stacked gate transistors 17 connected together. Memory cells 15 in the same column also have the control gates 38 of the first stacked gate transistors connected together, and have the control gates 38 of the second stacked gate transistors connected together. Finally, memory cells 15 in the same row have the gates of the transistors 11 connected together. Further, all of the memory cells 15 are manufactured on a planar surface of a semiconductor substrate.

It is one object of the present invention to increase the density of the array 10 and to provide methods for manufacturing such improved memory cell array.

SUMMARY OF THE INVENTION

The present invention relates to a method of making an isolation-less array of non-volatile memory cells in a semiconductor substrate, which has a planar surface with the substrate being of a first conductively type. A plurality of spaced apart trenches are formed in the planar surface of the substrate in a first direction, with each trench having a first sidewall, a second sidewall and a bottom wall. A pair of floating gates are formed in each trench along the first and second sidewalls, with each floating gate spaced apart from the first and second sidewalls, respectively. A first terminal of a second conductivity type is formed along the bottom wall of each trench in the substrate. A control gate is formed in each trench; with each control gate insulated from and capacitively coupled to the floating gates in the trench and insulated from the first terminal along the bottom wall of the trench. A conductor is formed on the planar surface, with the conductor spaced apart from the planar surface. The conductor is patterned along a second direction substantially perpendicular to the first direction to form a plurality of spaced apart strips of conductors, with an opening between each paid of conductor strips. The floating gates in each trench is cut.

DETAILED DESCRIPTION OF THE INVENTION

Figure 1:
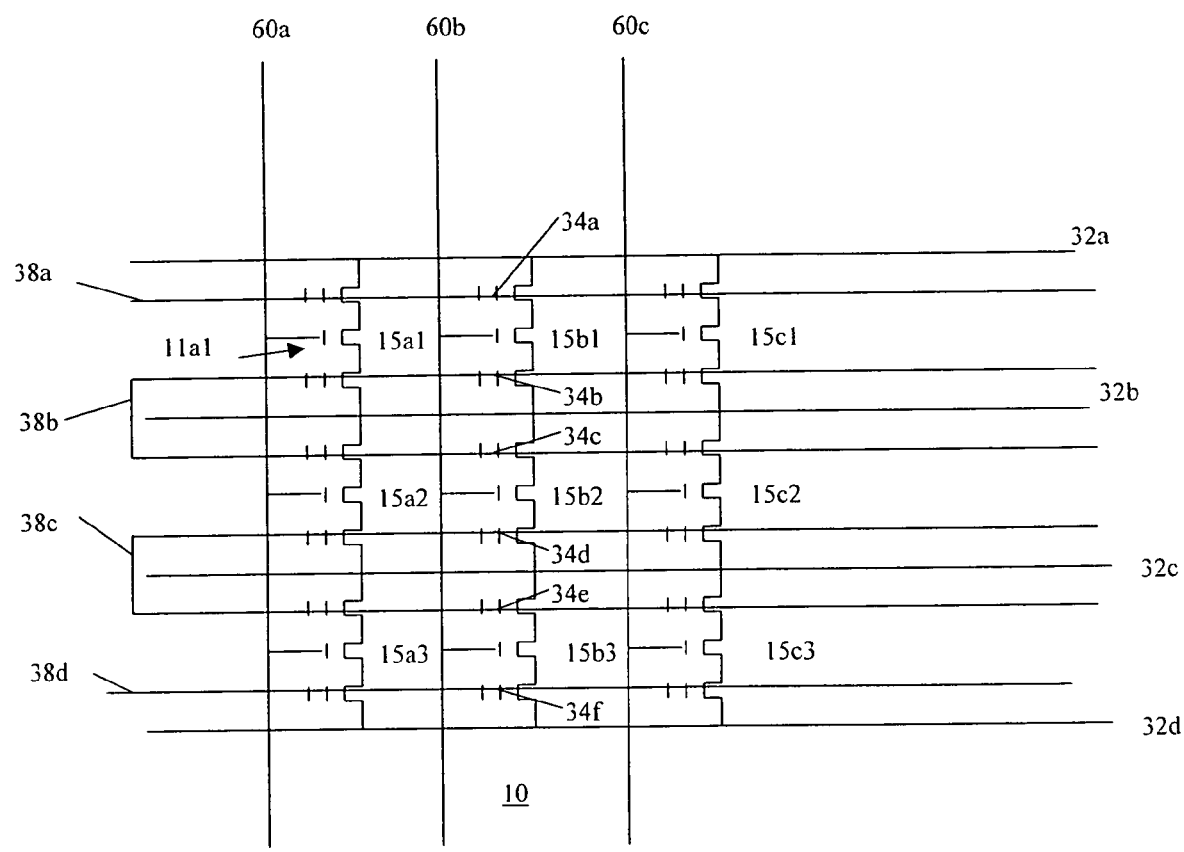
FIG. 1 is a schematic circuit diagram of a memory cell array which is made by the method of the present invention.
Figure 2A:
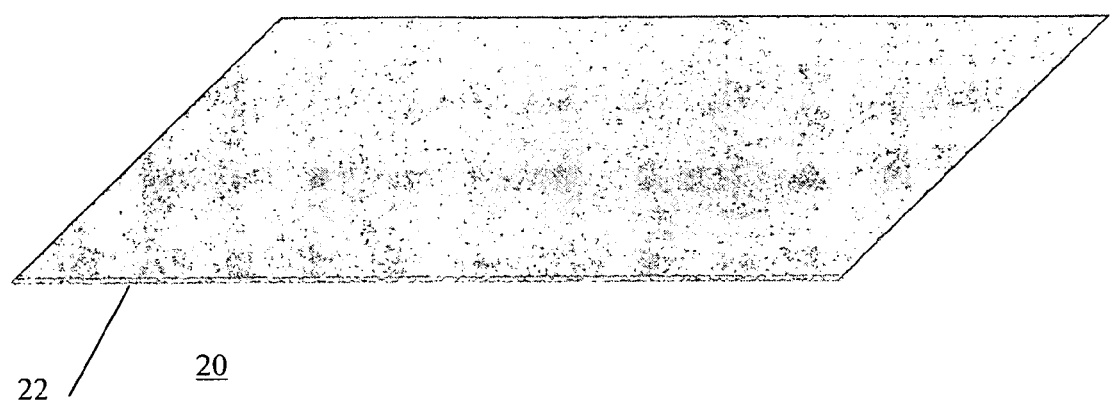
FIGS. 2A–2C are perspective cross sectional views of the steps of the present invention to make an isolation-less, contact-less array of floating gate non-volatile memory cells.

The method of the present invention is illustrated in FIGS. 2A–2H which show the process steps in making the memory cell array 10 shown in FIG. 1. The method begins with a semiconductor substrate 20, which is preferably of P type and is well known in the art, having a planar surface 22. This is shown in FIG. 2A. The thickness of the layers described below will depend upon the design rules and the process technology generation. What is described herein is for the 90 nm process. However, it will be understood by those skilled in the art that the present invention is not limited to any specific process technology generation, nor to any specific value in any of the process parameters described hereinafter. The substrate 20 is not a processed to form any field oxide region or shallow trench isolation (STI) regions to separate rows of columns of memory cells formed or to be formed in the substrate 20.

Figure 2B:
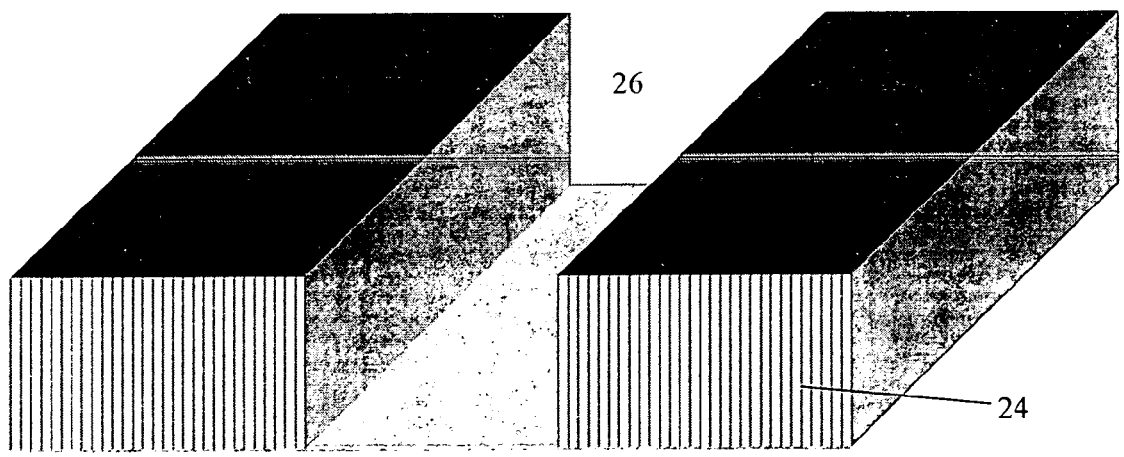

In the first step of the method of the present invention, as illustrated in FIG. 2B, a masking material, such as silicon nitride 24, is deposited on the surface 22 of the substrate 20 and is then patterned to form openings 26. The openings 26 are plurality of columns or stripes which are opened in the silicon nitride 24 exposing the surface 22 of the substrate 20. This can be done, by conventional photo-lithographic technique using masking and etching. It should be noted, that as used herein, the term "column" or "row" may be used interchangeably and is not limited to any specific direction.

Figure 2C:
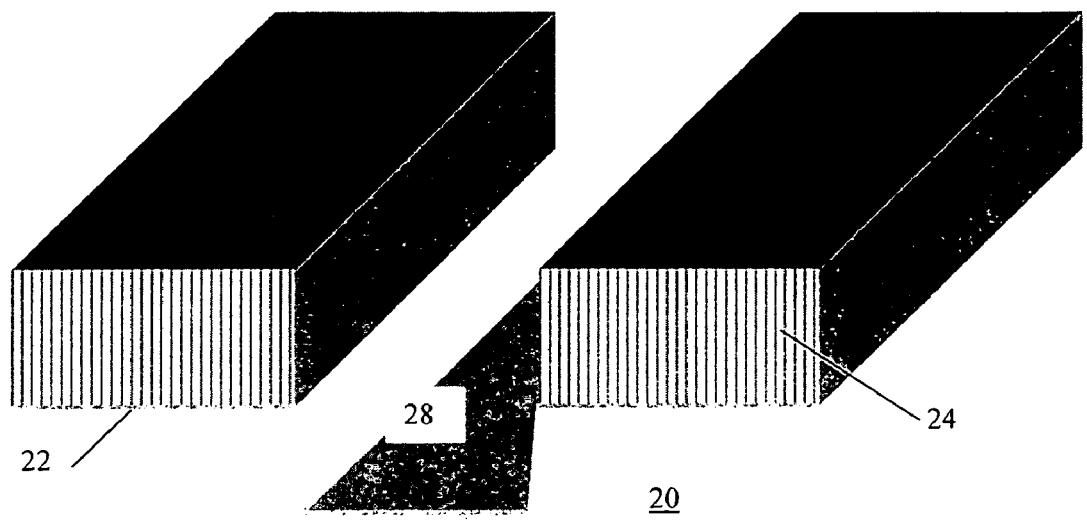

The next step is to cut trenches 28 into the substrate 20 through the openings 26. Each trench 28 extends continuously in a column direction. This is shown in FIG. 2C. The result in trench 28 has two side walls and a bottom wall. This exposes the silicon substrate 20 in the trench 28.

An oxidation process is performed to oxidize the exposed silicon within the trenches 28 of the substrate 20. This can be done, for example, by thermal oxidation of the structure shown in FIG. 2C, for 1000 degrees for 60 second. The result is the formation of a layer 30 of silicon dioxide along the side walls and along the bottom wall of the trench 28. The layer 30 of silicon dioxide is approximately eighty (80) angstroms thick. It should be recognized that the dimensions disclosed herein and the processes disclosed herein are for a lithography process of 90 nm dimension. Clearly, sizing to a different lithography size would change the dimensions of thickness, time, temperature, etc. A layer of polysilicon 34 is then deposited everywhere, including on the layer of silicon dioxide 30. The layer 34 of polysilicon is then anisotropically etched forming a spacer of polysilicon 34 along each of the two side walls of the trench 28.

The polysilicon spacers 34 along the two side walls of the trench 28 can be shaped such that a tip is formed along one end thereof, the end farthest away from the bottom wall of the trench 28. This can be accomplished by depositing polysilicon such that it completely fills the trench 28. A planarizing etch process, such as chemical-mechanical-polishing (CMP), leaves the polysilicon surface level with the top of the nitride 24. A further etch recesses the polysilicon to the desired level. A sloped etch such that polysilicon 34 adjacent to nitride 24 is etched slower results in an acute angle forming at the interface of polysilicon 34 and nitride 24. An oxide dielectric spacer formed by oxide deposition and anisotropic etch defines a thickness region adjacent to each trench edge of nitride 24. This oxide serves as an etch mask so that polysilicon 34 is separated into two pieces, one piece for each side wall of the trench 28.

Alternatively, a tip can be formed at the other end of the polysilicon spacer 34, the end closest to the bottom wall of the trench 28. This can be accomplished by forming the trench wall 28 with an obtuse angle relative to the trench bottom. Polysilicon spacers 34 are formed by deposition and vertical etch. This leaves a polysilicon spacer along each of the side walls of the trench 28. The angle difference between the wall-side polysilicon face and the open-side polysilicon face forms a tapered shape to the polysilicon spacer with the narrow end closest to the bottom wall of the trench 28. With sufficient angle and depth, this taper forms a sharp tip.

Figure 2D:
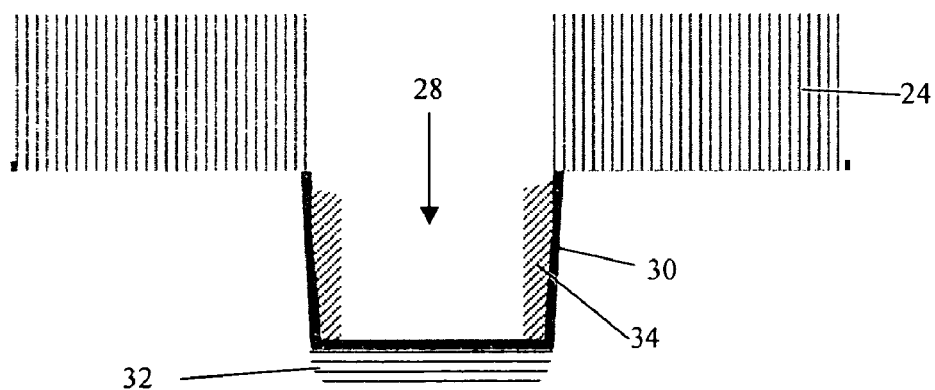
FIGS. 2D–2H are cross-sectional views of further steps after the steps shown in FIGS. 2A–2C in the method of the present invention.

The choice whether the tip is formed at one end of the polysilicon spacer 34 which is furthest away from the bottom wall of the trench 28 or is at the end which is closest to the bottom wall of the trench 28 depends upon the manner of the erased that is desired, as will be explained hereinafter. In any event, the tip at either one end or the other end of the spacer 34 is formed. An implant step is then performed which forms the buried source line 32 along the bottom wall of the trench 28. The resultant structure is shown in FIG. 2D.

Figure 2E:
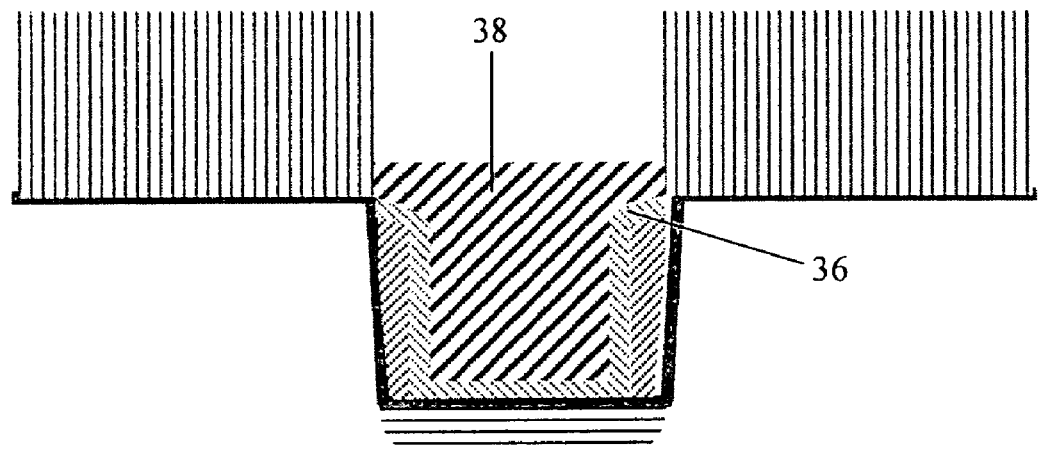
Figure 2F:
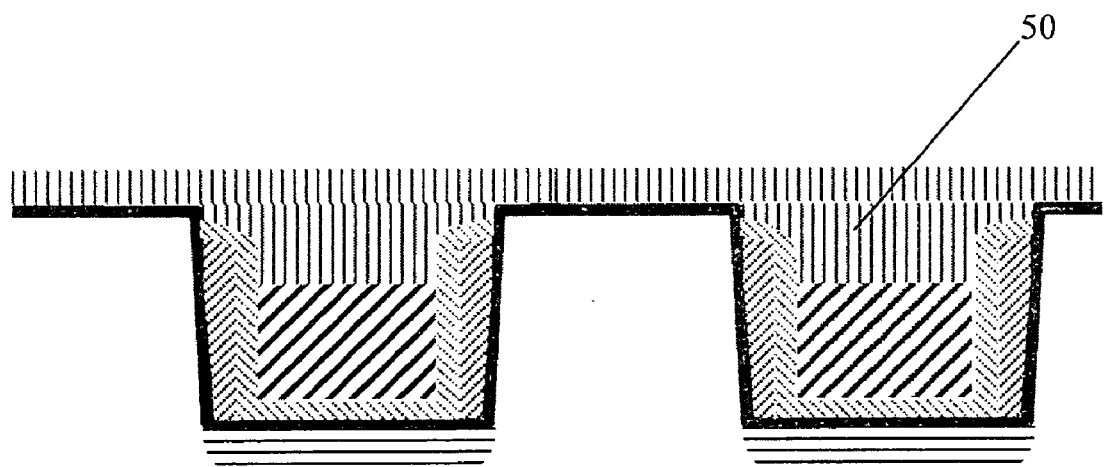

A thermal oxidation process is then performed which oxidizes the polysilicon spacer 34 and forms an oxide region 36 which covers the polysilicon spacer 34 along the side walls of the trench 28. In addition, the thermal oxidation process oxidizes the silicon substrate 20 along the bottom wall of the trench 28. The layer of oxide of 36 then covers the polysilicon spacer 34 and is along the bottom wall of the trench 28. Polysilicon 38 is then deposited everywhere and fills the trench 28. CMP (chemical-mechanical polishing) is then used to remove the polysilicon 38 deposited on the silicon nitride 24 and to planarize the polysilicon 38 so that the level of the polysilicon 38 in the trench 28 is planar with the level of the silicon nitride 24. The polysilicon 38 is then etched by Reactive Ion Etch (RIE) to a level below the top surface of the silicon nitride 24. The resultant structure is shown in FIG. 2E.

RIE etching of the polysilicon 38 continues until the top most level of the polysilicon 38 is below the top most level of the polysilicon floating gate 34. The silicon nitride 24 is then removed. Silicon dioxide 50 is then deposited everywhere including in the trench 28 and fills to a level above the planar surface 22 of the substrate 20. The height of the silicon dioxide 50 exceeds the planar surface 22 of the substrate 20 determines the gate oxide of the switch transistor 11. The resultant structure is shown on FIG. 2F.

Figure 2G:
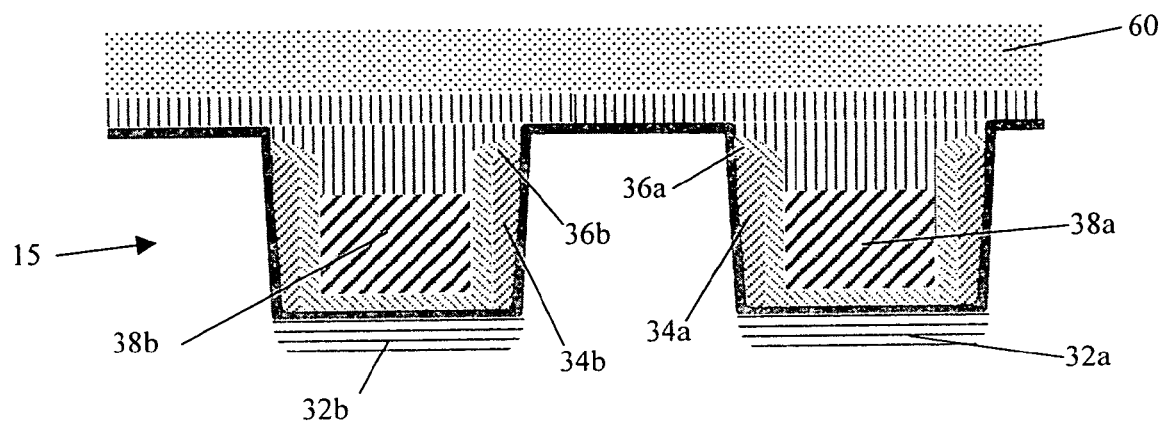
Figure 2H:
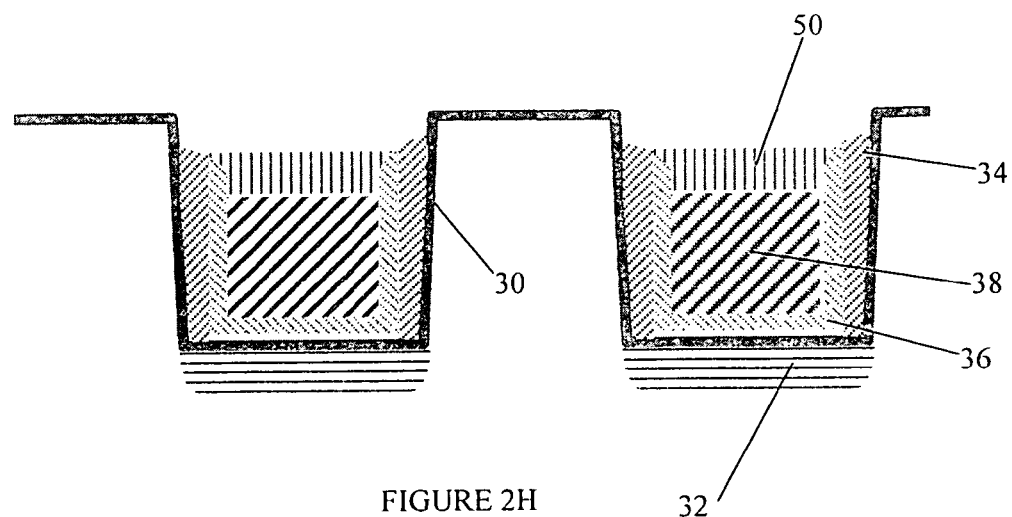

Polysilicon 60 is then deposited on the silicon dioxide 50. The polysilicon 60 is then patterned to form a plurality of openings (not shown) which are a plurality of rows or strips that are opened in a direction perpendicular to the trenches 28. These openings in the row direction expose the surface 50 of the silicon dioxide. This opening can be done by conventional photo-lithographic technique using masking and etching. With the polysilicon 60 as a mask, RIE or chemical etching of the exposed silicon dioxide 50 through these openings in the row direction can be made. The silicon dioxide 50 is etched with polysilicon as the etched stop. Since the floating gate 34 is at a level which is "higher" than the control gate 38, the polysilicon 34 would be first exposed. This is shown in FIG. 2H.

With the polysilicon 34 exposed, RIE or chemical etching is changed to etched polysilicon and the polysilicon 34 is then removed thereby cutting the polysilicon 34 to form islands of floating gates 34. In cutting the polysilicon 34, it should be noted that since silicon dioxide 50 continues to be "on top" of the polysilicon 38 the silicon dioxide 50 protects the polysilicon 38 from also being "cut" in the trench direction. The resultant structure is an isolation-less, contact-less memory array 10 shown in FIG. 1.

It should be noted that an alternative method of forming the array 10 is as follows. This alternative method is a non-self align method. In this method, the steps of forming the floating gate 34 using steps 2A–2D are the same as previously described.

Once the floating gate 34 is formed, the silicon nitride 24 is then removed. Thereafter, a masking material, such as photoresist, is deposited everywhere on the planar surface 22 of the substrate 20 and in the trench 28. The photoresist is then etched leaving openings in the row direction which is perpendicular to the trenches 28. Through the openings, the floating gates 34 are then cut to form islands. Thereafter, the photoresist is removed.

The formation of the silicon dioxide 36 on the floating gate 34 follows which is then followed by the polysilicon 38 filling in the trenches 28. The structure is then subject to a CMP process to remove the polysilicon 38 above the planar substrate 22 and to planarize the polysilicon 38 to the planar surface 22 of the substrate 20. Finally, silicon dioxide 50 is then deposited everywhere forming the gate oxide for the switch transistor 11. Thereafter, polysilicon 60 is deposited and masked and cut to form the row lines which make contact with the gate of the transistors 11.

Memory Cell Operation

The operation of the memory cell 15 shown in FIG. 2G will now be described.

Erase

There are two erase modes. In a first mode, the memory cell 15 is erased by applying 0 volts to the control gates 38(a,b), and 0 volts to the source regions 32(a,b). Since the same voltage is applied to both source regions 32(a,b), no charges will conduct in the channel region. Furthermore, because the control gates 38(a,b) are highly capacitively coupled to the floating gates 34(a,b), the floating gates 34(a,b) will experience a low voltage. A voltage of between 8 to 12 volts is applied to the word line 60. This causes a large voltage differential between the floating gates 34(a,b) and the word line 60. Any electrons stored on the floating gates 34(a,b) are pulled by the positive voltage applied to the word line 60, and through the mechanism of Fowler-Nordheim tunneling, the electrons are removed from the floating gates 34(a,b), and tunnel through the tunneling oxide 36 onto the word line 60. This mechanism of poly-to-poly tunneling for erase is set forth in U.S. Pat. No. 5,029,130, whose disclosure is incorporated herein in its entirety by reference. In this mechanism, all of the cells 15 connected by the same word line 60 having the positive voltage applied thereto will be erased simultaneously. Thus, the floating gate 34 has a tip near an end which is furthest away from the bottom wall of the trench 58. Due to the fact that voltage potentials are measured relative to one another, other voltages changed by a constant offset from one another are equivalent and may be used. For example, in the preceding first mode, a negative voltage of −8 to −10 volts may be applied to the control gates 38(a,b) and zero to positive potential applied to the word lines 60. This creates the same voltage differential to effect Fowler-Nordheim tunneling through oxide 36 as noted above.

In a second mode, the memory cell 15 is erased by applying a negative voltage, such as −10 volts, to the control gates 38(a,b). A positive voltage such as 3 volts is applied to selective source lines 32. Word lines 60 may be floating or held to low potential. The action of the negative voltage on the control gates 38(a,b) and the slight positive voltage on the selective source line 32 will cause the two floating gates 34 in the same trench 58 as the source line to be erased. In this mode, the tip of the floating gate is located at an end which is closest to the bottom wall of the trench 58. This permits electrons to tunnel through the Fowler-Nordheim mechanism from the floating gate 34(a,b) to the selected source line 32.

Programming

Programming of the memory cell 15 can occur in one of two mechanisms: either the first floating gate 34a is programmed or the second floating gate 34b is programmed. Let us first discuss the action of programming the first floating gate 34a, i.e. storage of electrons on the first floating gate 34a. The first source region 32a is held at a positive voltage of between 7 to 12 volts. The first control gate 38a is held at a positive voltage of between 2 to 5 volts. The word line 60b is held at a positive voltage of 1–3 volts. The second control gate 38b is held at a positive voltage of between 1–2.5 volts. The second source region 32b is held at 0 volts. Because the second control gate 38b is strongly capacitively coupled to the second floating gate 34b, the positive voltage of 1–2.5 volts on the second control gate 38b is sufficient to turn on the second portion of the channel region (the portion of the substrate 20 near the side wall, adjacent to the floating gate 34b), even if the second floating gate 34b is programmed, i.e. has electrons stored thereon. The positive voltage of 1–2 volts on the word line 60b is sufficient to turn on the third portion of the channel region (the portion of the substrate 20 near the planar surface 22 between the trenches 58). The positive voltage of 10–15 volts on the first source region 32a is sufficient to attract the electrons in the channel. The positive voltage of 2 to 3 volts on the first control gate 38a is sufficient to turn on the first portion of the channel region (because the first floating gate 34a is erased). Thus, electrons will traverse in the channel region from the second source region 38b to the first source region 38a. However, at the junction in the channel region where the channel region takes substantially a 90 degree turn in the direction from the planar surface to the first trench 34a, the electrons will experience a sudden increase in voltage, caused by the positive high voltage of the first source region 38a. This causes the electrons to be hot channel injected onto the first floating gate 34a. This mechanism of hot channel electron injection for programming is set forth in U.S. Pat. No. 5,029,130, whose disclosure is incorporated herein in its entirety by reference.

To program the second floating gate 34b, the voltages applied to the first control gate 38a, first source region 32a are reversed from those applied to the second control gate 38b, and second source region 32b.

Read

Reading of the memory cell 15 can occur in one of two mechanisms: either the state of the first floating gate 34a is read, or the state of the second floating gate 34b is read. Let us first discuss the action of reading the state of the second floating gate 34b, whether electrons are stored on the second floating gate 34b. The first source region 32a is held at a positive voltage of between 2 to 3.5 volts. The first control gate 38a is held at a positive voltage of between 2 to 3 volts. The word line 60b is held at a positive voltage of 2–3.5 volts. The second source region 32b is held at 0 volts. The second control gate 38b is held at a positive voltage of between 1–2.5 volts. The positive voltage of 2–3 volts on the first control gate 38a, and the positive voltage of 2–3.5 volts on the first source region 32a are sufficient to turn on the first portion of the channel region (the portion of the substrate 20 near the side wall, adjacent to the floating gate 34a), even if the first floating gate 34a is programmed, i.e. has electrons stored thereon. The positive voltage of 1.5–2.5 volts on the word line 60b is sufficient to turn on the third portion of the channel region. The positive voltage of between 1 to 2.5 volt on the second control gate 38b is sufficient to turn on the second portion of the channel region only if the second floating gate 34b is not programmed. In that event, electrons will traverse in the channel region from the second source region 38b to the first source region 38a. However, if the second floating gate 34b is programmed, then the positive voltage of between 1 to 2.5 volt is not sufficient to turn on the second portion of the channel region. In that event, the channel remains non-conductive. Thus, the amount of current or the presence/absence of current sensed at the first source region 32a determines the state of programming of the second floating gate 34b.

To read the first floating gate 34a, the voltages applied to the first control gate 38a and first source region 32a are reversed from those applied to the second control gate 38b and second source region 32b.

Memory Cell Array Operation

The operation of an array of memory cells 15 will now be described. Schematically, an array of memory cells is shown in FIG. 1. As shown in FIG. 1, an array of memory cells 15 comprises a plurality of memory cells arranged in a plurality of columns: 15a(1-k), 15b(1-k), and 15c(1-k) and in rows: 15(a-n)1, 15(a-n)2 and 15(a-n)3. The word line 60 connected to a memory cell 15 is also connected to other memory cells 15 in the same column. The first and second source regions 32 and the first and second control gates 38 connected to a memory cell 15 are also connected to other memory cells in the same row.

Erase

In the erase operation, memory cells 15 in the same column connected by the common word line 60b are erased simultaneously. Thus, for example, if it is desired to erase memory cells 15 in the column 15b(1-n), the word line 2 is held at between 8 to 12 volts. The unselected word lines 1 and 3 are held at 0 volts. All the source region lines 32 and control gate lines 38 are held at 0 volts. In this manner all of the memory cells 15b(1-n) are erased simultaneously, while no erase disturbance occurs with respect to the memory cells 15 in the other columns because all five terminals to the memory cells 15 in all the other columns are at ground voltage.

Program

Let us assume that the first floating gate 34a of the memory cell 15b1 is to be programmed. Then based upon the foregoing discussion, the voltages applied to the various lines are as follows: line 32a is at a positive voltage of between 7 to 12 volts. Line 38a is at a positive voltage of between 2 to 5 volts. Word line 60b is at a positive voltage of between 1–3 volts. Line 38b is held at a positive voltage of 1–2.5 volts. Line 32b is held at 0 volts. All the other unselected column lines, i.e. lines 1 and 3 are at 0 volts. Similarly, all the other row lines, such as 38c, 38d, and 32c and 32d are at 0 volts. The "disturbance" on the unselected memory cells 15 are as follows:

For the memory cells 15 in the unselected column, the application of 0 volts to lines 1 and 3 means that none of the channel regions for those memory cells 15c(1-n) and 15a(1-n) are turned on, because the third portion of the channel region (the portion to which the word line 1 and 3 control) are not turned on. Thus, there is no disturbance. For the memory cell 15b2 which is in the same selected column, but in an unselected row, the application of 0 volts to line 38c means that the portion of the channel region of the memory cell 15b2 which is adjacent to the source region 32c will not be turned on. In that event the channel between the source region 32c and the source region 32b will be turned off. Thus, little or no disturbance to memory cell 15b2 would occur. Similarly for all other memory cells 15 in the selected column but unselected row, a portion of the channel region of those memory cells will not be turned on due to the 0 volts being applied to the unselected control gates 38.

To program the second floating gate 34b, the voltages applied to the first control gate line 38a, first source region line 32a are reversed from those applied to the second control gate line 38b, and second source region line 32b. All the other lines will have the same voltages as discussed for the programming of the first floating gate 34a.

Read

Let us assume that the second floating gate 34b of the memory cell 15b1 is to be read. Then based upon the foregoing discussion, the voltages applied to the various lines are as follows: The source region line 32a is held at a positive voltage of between 2 to 3.5 volts. The first control gate line 38a is held at a positive voltage between 2 to 3 volts. The word line 60b is held at a positive voltage of 2–3.5 volts. The second source region line 32b is held at 0 volts. The second control gate line 38b is held at a positive voltage of between 1–2.5 volts.

The voltages applied to the unselected word lines 60a and 60c and the unselected source regions lines 32c and 32d, and the unselected control gate lines 38c and 38d are all held at ground or 0 volts. The "disturbance" on the unselected memory cells 15 is as follows:

For the memory cells 15 in the unselected columns, the application of 0 volts to lines 1 and 3 means that none of the channel regions for those memory cells 15c(1-k) and 15a (1-k) is turned on. Thus, there is no disturbance. For the memory cell 15b2 which is in the same selected column, but in an unselected row, the application of 0 volts to line 38c means that the portion of the channel region of the memory cell 15b2 which is adjacent to the source region 32c will not be turned on. In that event the channel region will be turned off. Thus, little or no disturbance to memory cell 15b2 would occur. Similarly, for all the other memory cells in the same selected column but unselected rows, there will not be any disturbance.

To read the first floating gate 34a, the voltages applied to the first control gate line 38a, first source region line 32a are reversed from those applied to the second control gate line 38b, and second source region line 32b. All the other lines will have the same voltages as discussed for the reading of the second floating gate 34b.

NAND Operation

One unique feature of an array of memory cells 15 of the present invention is the ability of the array to operate as a NAND device. A NAND device has a string of NVM connected in a serial fashion to a source of programming/read voltage. Let us assume that one string of NVM cells comprises: 15b1, 15b2, and 15b3 all in the same column connected by the same word line 60b.

Erase

The erase operation for the string of NVM cells in the same string is the same as that described previously for memory cells being erased in an array. Cells in the same column connected by the common word line 60b are erased simultaneously. Thus, cells in the same NAND string are erased simultaneously.

Program

To program a particular cell, in a string of NVM cells, e.g. floating gate 34e of cell 15b3 in a string of NVM cells comprising cells 15b(1-3), the various voltages applied are as follows: A programming voltage, such as 7–12 volts, is first applied at buried diffusion line 32a. A "high" voltage is applied to the control gate 38a, sufficient to "turn on" the channel adjacent the floating gate 34a. A "high" voltage (1–3 volts) is applied to the word line 60b to "turn on" the channel between the floating gate 34a and floating gate 34b. A "high" voltage (2–5 volts) is applied to the control gate 38b to turn on the channel adjacent to the floating gate 34b. This causes the entire channel region between the buried diffusion line 32a and 32b to be conducting. Buried diffusion line 32b is held floating. This causes the programming voltage from diffusion line 32a to be present at diffusion line 32b. The "turning on" of the channel region for other cells continues until the programming voltage is at the buried diffusion line 32c. A ground voltage is applied to buried diffusion line 32d, which is at the other end of the chain of a string of NVM cells. A voltage of 1–2.5 volts is applied to the control gate 38d, which turns on the channel adjacent to the floating gate 34f. Since the word line 60b is at a high voltage to turn on the channel region between the floating gate 34f and floating gate 34e, electrons traverse the channel region and are injected by hot channel electron injection onto the floating gate 34e.

To program the floating gate 34f of memory cell 15b3, the programming voltage is first applied to the other end of the string of NVM cells, i.e. to diffusion line 32d. Ground voltage is applied to diffusion line 32a, and through the mechanism previously discussed, the ground voltage is transferred to diffusion line 32c, which then causes hot channel electrons to program the floating gate 34f.

Read

To read a particular cell, in a string of NVM cells, e.g. floating gate 34e of cell 15b3 in a string of NVM cells comprising cells 15b(1-3), the various voltages applied are as follows: A read voltage of 2 to 3.5 volts is applied to the diffusion line 32d. Ground voltage is applied to diffusion line 32a. A positive voltage, such as 1.5–3.5 volts is applied to the word line 60b. A positive voltage such as 1 to 2.5 volts is applied to each of the control gate 38a, 38b, and 38c. The diffusion lines 32b and 32c would receive the ground voltage from diffusion line 32a. Electrons traversing from diffusion line 32c to 32d would be read and would be determinative of the state of the floating gate 34e.

From the foregoing it can be seen that a novel method of manufacturing is disclosed. It should be appreciated that although the preferred embodiment has been described in which a single bit is stored in each of the two floating gates in a memory cell, it is also within the spirit of the present invention to store multi-bits on each one of the floating gates in a single memory cell, thereby increasing further the density of storage.

What is claimed is:

1. A method of making an isolation-less array of non-volatile memory cells in a semiconductor substrate, having a planar surface; said substrate is of a first conductivity type comprising;
    forming a plurality of spaced apart trenches in said planar surface of said substrate in a first direction, each trench having a first sidewall, a second sidewall and a bottom wall;
    forming a pair of floating gates along the first and second sidewalls in each trench, each floating gate spaced apart from the first and second sidewalls, respectively;
    forming a first terminal of a second conductivity type along the bottom wall of each trench in the substrate;
    forming a control gate in each trench; each control gate insulated from and capacitively coupled to the floating gates in the trench and insulated from the first terminal along the bottom wall of the trench, wherein each control gate is continuous in said first direction;
    forming a conductor on said planar surface, said conductor spaced apart from said planar surface, wherein said conductor serving as a gate for a transistor between adjacent trenches;
    patterning said conductor along a second direction substantially perpendicular to said first direction to form a plurality of spaced apart strips of conductors, with an opening between each pair of conductor strips; and
    cutting each pair of floating gates in each trench.

2. The method of claim 1 wherein the step of forming a pair of floating gates comprises:
    forming a layer of silicon dioxide along said first sidewall, said second sidewall, and said bottom wall of each trench;
    depositing a layer of polysilicon along said silicon dioxide of said first sidewall, said second sidewall and said bottom wall of each trench;
    anisotropically etching said layer of polysilicon, to remove said layer of polysilicon from said bottom wall, forming a pair of polysilicon floating gate spacers along the first and second sidewalls in each trench.

3. The method of claim 2 further comprising the step of forming a tip along each of said floating gates at an end closest to said bottom wall in each trench.

4. The method of claim 2 further comprising the step of forming a tip along each of said floating gates at an end furthest away from said bottom wall in each trench.

5. The method of claim 1 wherein said cutting step cuts each pair of floating gates through said opening in each trench without cutting the control gate.

6. The method of claim 2, wherein said step of forming a plurality of spaced apart trenches in said planar surface further comprises:
    applying a layer of masking material on said planar surface of said substrate; patterning said masking material in said first direction to form a plurality of masking strips and a plurality of first openings with a first opening between each pair of masking strips;
    etching said substrate to form said plurality of trenches through said first openings.

7. The method of claim 6 wherein the masking material is silicon nitride.

8. The method of claim 1 wherein said cutting step is performed prior to said control gate being formed in each trench.

9. The method of claim 8 wherein the step of forming a pair of floating gates comprises:
    forming a layer of silicon dioxide along said first sidewall, said second sidewall, and said bottom wall of each trench;
    depositing a layer of polysilicon along said silicon dioxide of said first sidewall, said second sidewall and said bottom wall of each trench;
    anisotropically etching said layer of polysilicon, to remove said layer of polysilicon from said bottom wall, forming a pair of polysilicon floating gate spacers along the first and second sidewalls in each trench.

10. The method of claim 9 further comprising the step of forming a tip along each of said floating gates at an end closest to said bottom wall in each trench.

11. The method of claim 9 further comprising the step of forming a tip along each of said floating gates at an end furthest away from said bottom wall in each trench.

* * * * *